US009336833B2

(12) United States Patent  
Walsh

(10) Patent No.: US 9,336,833 B2  
(45) Date of Patent: May 10, 2016

(54) IDENTIFYING A DIGITAL DATA HANDLING UNIT

(71) Applicant: International Business Machines Corporation, Armonk, NY (US)

(72) Inventor: Andrew S. Walsh, Winchester (GB)

(73) Assignee: International Business Machines Corporation, Armonk, NY (US)

( * ) Notice: Subject to any disclaimer, the term of this patent is extended or adjusted under 35 U.S.C. 154(b) by 158 days.

(21) Appl. No.: 14/177,058

(22) Filed: Feb. 10, 2014

(65) Prior Publication Data

US 2014/0293549 A1    Oct. 2, 2014

(30) Foreign Application Priority Data

Mar. 28, 2013   (GB) .................................. 1305689.0

(51) Int. Cl.
```
G06F 1/16       (2006.01)
G11B 33/12      (2006.01)
G11B 33/10      (2006.01)
```
(52) U.S. Cl.
CPC ................ *G11B 33/12* (2013.01); *G11B 33/10* (2013.01)

(58) Field of Classification Search
USPC ............. 348/370, 45, 79, 333.09, 372, 208.4; 414/797; 235/462.28, 469, 462.11, 235/462.25, 462.41, 462.04; 700/275, 216, 700/250, 254, 266, 245, 231, 94, 17, 258, 700/251, 259, 276; 345/428, 8, 168, 161, 345/179, 589, 173; 361/679.31, 679.29, 361/679.32, 679.47, 679.33, 679.54, 361/679.02, 679.46, 679.5, 679.08, 679.27, 361/679.21, 679.41, 679.56  
See application file for complete search history.

(56) References Cited

U.S. PATENT DOCUMENTS

| | | |
|---|---|---|
| 5,141,127 A | 8/1992 | Graef et al. |
| 5,179,612 A | 1/1993 | Rochester et al. |
| 5,220,632 A | 6/1993 | LoStracco |
| 6,061,244 A | 5/2000 | O'Sullivan et al. |
| 6,483,107 B1 | 11/2002 | Rabinovitz et al. |
| 6,570,770 B1 | 5/2003 | Ross et al. |
| 7,304,855 B1 | 12/2007 | Milligan et al. |
| 2012/0194350 A1 | 8/2012 | Crisp et al. |
| 2013/0108408 A1* | 5/2013 | Saison et al. .................. 414/797 |
| 2013/0248605 A1* | 9/2013 | Barber et al. ............ 235/462.28 |
| 2014/0340571 A1* | 11/2014 | Liberatore et al. ............ 348/370 |

FOREIGN PATENT DOCUMENTS

JP        2006164006         6/2006

OTHER PUBLICATIONS

Combined Search and Examination Report, Application No. GB1305689.0, Intellectual Property Office, United Kingdom, Aug. 12, 2013.

* cited by examiner

*Primary Examiner* — Hung Duong  
(74) *Attorney, Agent, or Firm* — David Zwick; Randall J. Bluestone

(57) ABSTRACT

A digital data handling unit has a manually graspable part operable for removal of the unit from a digital data handling host. The manually graspable part includes an illuminable portion which, when illuminated, serves to distinguishably identify a particular digital data handling unit. The illuminable portion may be an illuminable strip. The digital data handling unit may be one of a data processing unit, a data storage unit, a data controller subsystem unit or a data communication unit.

7 Claims, 5 Drawing Sheets

IDENTIFYING A DIGITAL DATA HANDLING UNIT

CROSS-REFERENCE TO RELATED APPLICATIONS

This application claims the benefit of priority from United Kingdom patent application number GB1305689.0, filed Mar. 28, 2013, which is hereby incorporated by reference in its entirety.

FIELD OF THE INVENTION

The invention relates to a digital data handling unit having a graspable part for removal. More particularly, the invention relates to distinguishably identifying the graspable part of a particular digital data handling unit.

BACKGROUND OF THE INVENTION

In the field of data processing, a common paradigm is to provide a racking framework into which are mounted a plurality of similar replaceable data processing, storage, or other digital data handling units. The replaceable units are typically arranged in a series of adjacent vertically repeating mounting locations in the racking framework. Typically, in a data processing environment, such racks are of standardized 19 inch format in which the slots for insertion of replaceable units are 19 inches (482.6 mm) wide. The height of the replaceable units is measured in rack units, or U, where 1 U is 1.75 inches (44.45 mm). A typical full height rack may be over 6 feet (1.8 m) in height and comprise 42 U of equipment, so 42 1 U units, or 21 2 U units for example.

In one arrangement a number of substantially identical individual removable digital data handling units may be positioned one above another. In another arrangement, a number of enclosures, for example 7 U in height, may be mounted in a rack. Each enclosure provides mounting locations for a number of identical vertically mounted digital data handling units, such as data processing units, for example blade servers. Other arrangements may include, for example, an enclosure having mounting locations for a number of vertically or horizontally arranged disk drives.

A trend over recent years has been for the removable digital data handling units to be made progressively smaller, so that more units may be fitted into a given rack framework. Whilst this provides for more economical use of rack space, it may lead to problems when individual units which fail need to be removed. Little frontal space is available on the removable digital data handling units for such things as status indication light emitting diodes (LEDs), sockets for wiring, and hand engageable elements, for example handles for removal, or handles including mechanisms for unlocking and removal, of the individual unit. It is consequently becoming easier for an operator to see an LED indicator showing a failure in a removable unit, for example, but to remove an adjacent or other unit in error by, for example, operating the wrong release handle. Such an error may have serious consequences in loss of data resulting from the interruption of data communication with a still operating replaceable unit.

It would be advantageous to provide a means to facilitate removal of the correct removable unit when a failure is identified.

SUMMARY

According to a first aspect, the invention provides a digital data handling unit comprising a manually graspable part operable for removal of the unit from a digital data handling host. The manually graspable part comprises an illuminable portion which, when illuminated, serves to distinguishably identify a particular digital data handling unit.

Preferably, the illuminable portion covers a substantial portion of the surface of the manually graspable part visible in normal use of the digital data handling unit.

Preferably, the substantial portion is at least 10 percent.

Preferably, the illuminable portion comprises an illuminable strip.

Preferably, the manually graspable part comprises a handle.

Preferably, the digital data handling host comprises mounting positions for a plurality of substantially similar removable digital data handling units.

Preferably, the illuminable portion when illuminated indicates that the digital data handling unit is in a safe state for removal.

Preferably, the illuminable portion is illuminated in response to an abnormal condition of the digital data handling unit.

Preferably, the illuminable portion is illuminated in response to a request signal from a system controller.

Preferably, the request signal is initiated in response to a human operator intervention.

Preferably, the illuminable portion comprises one of a fiber optically illuminated portion, a liquid crystal display portion or a light emitting diode portion.

Preferably, the digital data handling unit comprises one of a data processing unit, a data storage unit, a data controller subsystem unit or a data communication unit.

According to a second aspect, the invention provides a manually graspable part operable with a digital data handling unit for removal of the unit from a digital data handling host. The manually graspable part comprises an illuminable portion which, when illuminated, serves to distinguishably identify a particular digital data handling unit.

Preferably, the illuminable portion covers a substantial portion of the surface of the manually graspable part visible in normal use of the digital data handling unit.

Preferably, the substantial portion is at least 10 percent.

Preferably, the illuminable portion comprises an illuminable strip.

Preferably, the manually graspable part comprises a handle.

Preferably, the digital data handling host comprises mounting positions for a plurality of substantially similar removable digital data handling units.

Preferably, the illuminable portion when illuminated indicates that the digital data handling unit is in a safe state for removal.

Preferably, the illuminable portion is illuminated in response to an abnormal condition of the digital data handling unit.

Preferably, the illuminable portion is illuminated in response to a request signal from a system controller.

Preferably, the request signal is initiated in response to a human operator intervention.

Preferably, the illuminable portion comprises one of a fiber optically illuminated portion, a liquid crystal display portion or a light emitting diode portion.

Preferably, the digital data handling unit comprises one of a data processing unit, a data storage unit, a data controller subsystem unit or a data communication unit.

According to a third aspect, the invention provides a data processing system comprising a digital data handling host comprising mounting positions for a plurality of substantially similar removable digital data handling units. A removable digital data handling unit comprises a manually graspable part operable for removal of the unit from the host, the manually graspable part comprising an illuminable portion which, when illuminated, serves to distinguishably identify a particular digital data handling unit.

Preferably, the illuminable portion covers a substantial portion of the surface of the manually graspable part visible in normal use of the digital data handling unit.

Preferably, the substantial portion comprises at least 10 percent.

Preferably, the illuminable portion comprises an illuminable strip.

Preferably, the manually graspable part comprises a handle.

Preferably, the illuminable portion when illuminated indicates that the digital data handling unit is in a safe state for removal.

Preferably, the illuminable portion is illuminated in response to an abnormal condition of the digital data handling unit.

Preferably, the illuminable portion is illuminated in response to a request signal from a system controller.

Preferably, the request signal is initiated in response to a human operator intervention.

Preferably, the illuminable portion comprises one of a fiber optically illuminated portion, a liquid crystal display portion or a light emitting diode portion.

Preferably, the digital data handling unit comprises one of a data processing unit, a data storage unit, a data controller subsystem unit or a data communication unit.

According to a fourth aspect, the invention provides a method for identifying a digital data handling unit. The method comprises providing a manually graspable part operable for removal of the unit from a digital data handling host. The manually graspable part comprises an illuminable portion which, when illuminated, serves to distinguishably identify a particular digital data handling unit.

Preferably, the illuminable portion covers a substantial portion of the surface of the manually graspable part visible in normal use of the digital data handling unit.

Preferably, the substantial portion is at least 10 percent.

Preferably, the illuminable portion comprises an illuminable strip.

Preferably, the manually graspable part comprises a handle.

Preferably, the digital data handling host comprises mounting positions for a plurality of substantially similar removable digital data handling units.

Preferably, the illuminable portion when illuminated indicates that the digital data handling unit is in a safe state for removal.

Preferably, the method comprises recognizing an abnormal condition of the digital data handling unit and illuminating the illuminable portion in response.

Preferably, the method comprises sending a request signal to cause illuminating of the illuminable portion in response.

Preferably, the method further comprises a human operator initiating the sending of the request signal.

Preferably, the illuminable portion comprises one of a fiber optically illuminated Preferably, the digital data handling unit comprises one of a data processing unit, a data storage unit, a data controller subsystem unit or a data communication unit.

BRIEF DESCRIPTION OF THE DRAWINGS

Preferred embodiments of the present invention will now be described, by way of example only, with reference to the following drawings, in which.

DETAILED DESCRIPTION OF EMBODIMENTS

The present invention will be illustrated by reference to the IBM Storwize V7000 rack mounted disk storage system (IBM and Storwize are trademarks of International Business Machines Corporation, registered in many jurisdictions worldwide). This comprises a series of 2 U enclosures mounted one above another. Each enclosure houses at its front side a number of disk drives, typically 24 2.5 inch drives or 12 3.5 inch drives, each removable separately. At its rear side, enclosures may comprise a control enclosure or an expansion enclosure.

The IBM Storwize V7000 system is a modular storage system that is built on a common enclosure (control enclosure and expansion enclosure) that is Storage Bridge Bay (SBB) compliant. SBB is a specification created by the Storage Bridge Bay Working Group that defines a mechanical and electrical interface between a passive backplane drive array and the electronics packages that give the array its particular characteristics. SBB slot is the term used for the opening in a storage enclosure that accepts an SBB canister. SBB canister is the term used for any functional entity that can be inserted into an SBB slot. The canister is a replaceable unit that includes the SBB canister envelope and the bridge/controller card.

In the IBM Storwize V7000 system, there are two types of canisters, node canisters and expansion canisters. A node canister provides host interfaces, management interfaces, and Serial Attached SCSI (SAS) interfaces to the control enclosure. A node canister has cache memory, internal drives to store software and logs, and processing power to run the Storwize V7000 virtualizing and management software. An expansion canister provides SAS connectivity to the drives in an expansion enclosure. Expansion canisters are addressed via connection to node canisters. Each enclosure contains a pair of canisters to provide redundancy. Control enclosures contain two node canisters, and expansion enclosures contain two expansion canisters.

Figure 1:
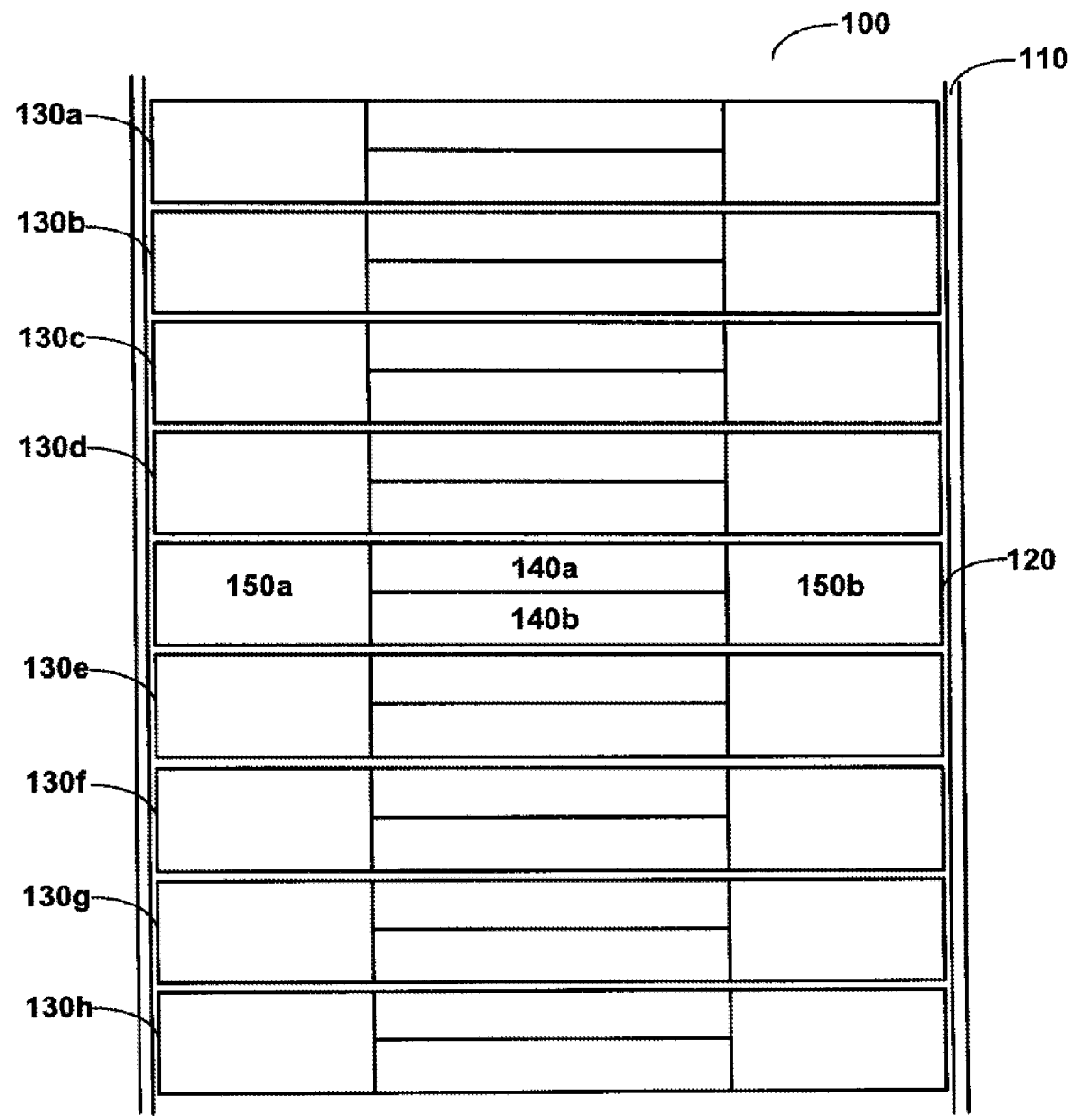
FIG. 1 illustrates the rear of an IBM Storwize V7000 rack system including a control enclosure according to the prior art.

FIG. 1 illustrates the rear of an example configuration for an IBM Storwize V7000 system suitable for use with a preferred embodiment of the present invention. In the example system 100, rack framework 110 comprises control enclosure 120 and eight expansion enclosures 130*a* to 130*h*. In the Storwize V7000, there are two canister slots, one above the other, in the middle of the chassis, occupied by canisters. Using control enclosure 120 as an example, the canisters are node canisters, the top slot being occupied by node canister 1, 140*a*, the bottom slot by node canister 2, 140*b*. The canisters are inserted different ways up, so that canister 1, 140*a*, appears the correct way up, and canister 2, 140*b*, upside down. There are two power supply slots, on the extreme left and extreme right, each taking up the full 2U enclosure height. The left slot is occupied by power supply 1, 150a, the right slot by power supply 2, 150b. The power supplies are inserted different ways up. Power supply 1 appears the correct way up, and power supply 2 upside down.

Figure 2:
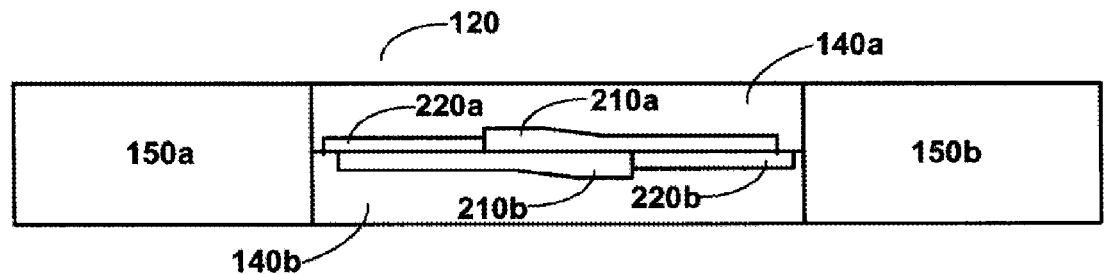
FIG. 2 illustrates an enlarged view of a control enclosure according to the prior art.

FIG. 2 illustrates an enlarged view of control enclosure 120 of FIG. 1. Power supplies 150a and 150b occupy the slots at the left and right edges of enclosure 120. Node canisters 140a and 140b occupy the upper and lower central slots respectively. A number of connection ports for data connections, and indicator lights, typically LED indicators, occupy the visible front surface of node canisters 140a and 140b, not shown in the drawing for clarity. LED indicators may indicate the status of various aspects of the operation of node canisters 140 and 140b. In addition, handles are present to facilitate removal of the node canisters from the enclosure. Two part handle 210a, 220a is operable for removal of node canister 140a, and two part handle 210b, 220b is operable for removal of node canister 140b. Because node canister 140b is inverted with respect to node canister 140b, the handles for the two canisters are adjacent to each other.

Figure 3:
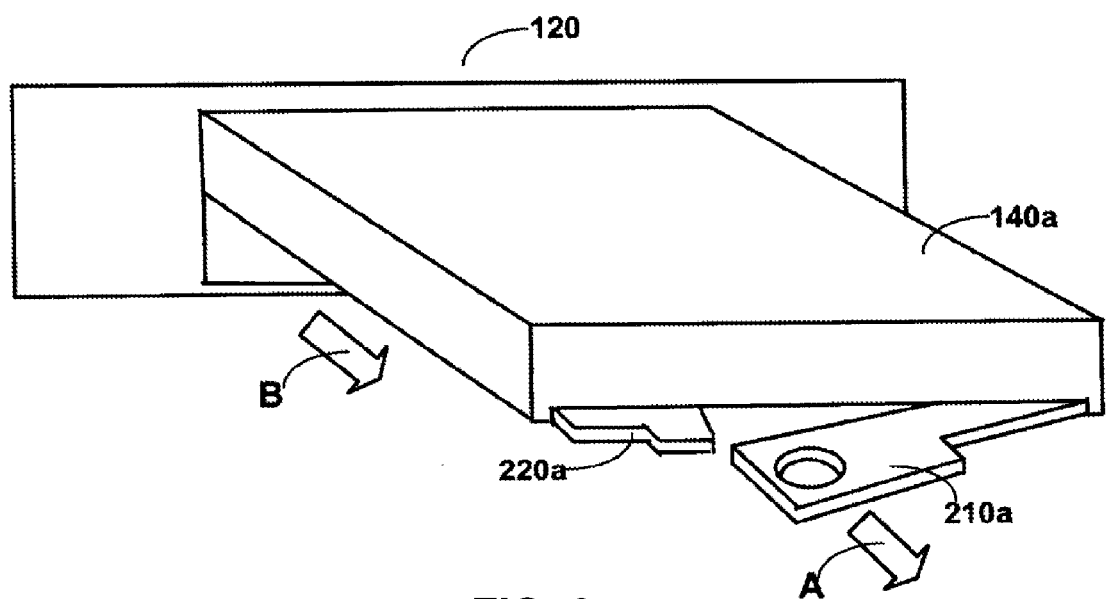
FIG. 3 illustrates the removal of a node canister from a control enclosure according to the prior art.

FIG. 3 illustrates the operation to remove canister 140a from control enclosure 120. Two part release handle 210a, 220a is linked to a latching mechanism which lockingly retains node canister 140a in its slot in enclosure 120. Two part release handle 210a, 220a is operated by squeezing the two parts 210a and 220a together. This action releases the latching mechanism retaining canister 140a in its slot in enclosure 120, and enables moveable handle element 210a to be moved, by operation of a hinged attachment point towards its right hand end, in the direction indicated by arrow A. Moveable handle part 210a may then be used to pull node canister 140a in the direction of arrow B, causing its electrical connections at the rear of its slot in control enclosure 120 to be disconnected. Node canister 140a may then be removed completely from its slot in enclosure 120.

Figure 4:
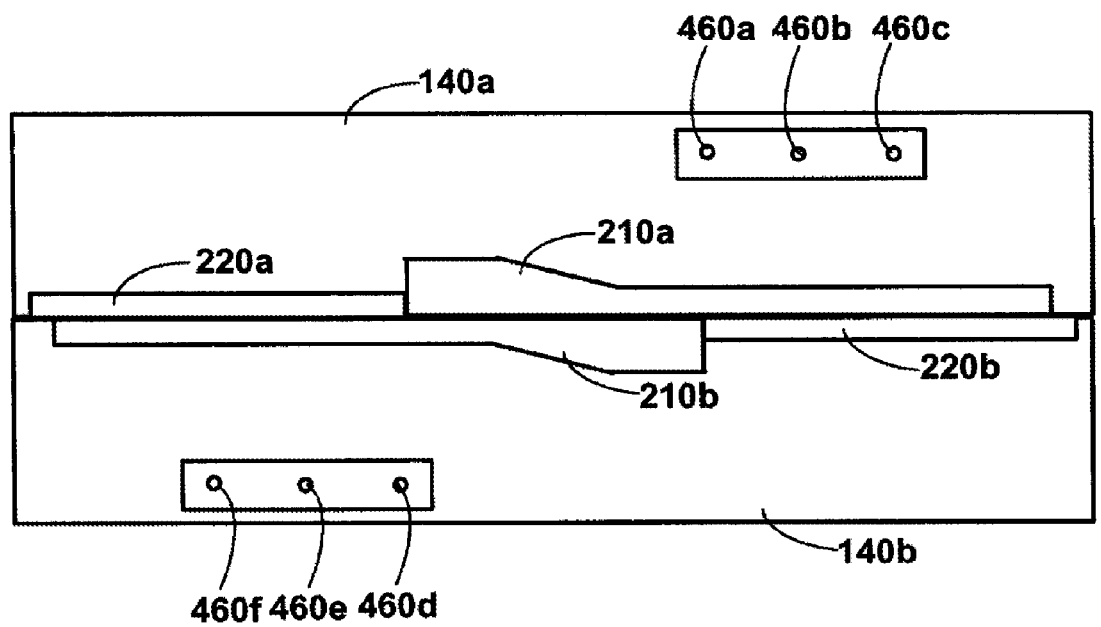
FIG. 4 illustrates a pair of node canisters installed in a control enclosure according to the prior art.

FIG. 4 illustrates a pair of node canisters 140a, 140b installed in control enclosure 120. The front surface of each canister comprises a number of connection ports and associated port status LED indicators, not shown on the drawing for clarity. Each node canister 140a, 140b also comprises three canister status and node identification LED indicators, 410a to 410c for top canister 140a, and 410d to 410f for bottom canister 140b. Looking at top node canister 140a, the three LED indicators comprise from left to right, Cluster status LED 410a (green in color), Fault LED 410b (amber in color), and Power LED 410c (green in color). The operational condition of node canister 140a may be determined from the illumination state of these LED indicators. Depending on the LED indicator, the illumination state may be constant illumination, off, or one or more flashing modes. Each of these states means something in terms of the operational condition of node canister 140a.

It will be apparent to a person skilled in the art that node canister 140a may need to be removed under certain circumstances, for example so that a replacement canister may be substituted for it. It will be apparent that the canister must be in a safe operational state before it is removed, as indicated for example by the illumination states of the canister status and node identification LED indicators 410a-c, i.e., not in an operational state in which data may be lost or corrupted by removal of the node canister 140a. It will also be apparent that, because of the proximity of release handle 210a, 220a of node canister 140a to release handle 210b, 220b of node canister 140b, it would be possible for an operator to operate handle 220a, 220b of node canister 140b in error, mistakenly identifying it as the release handle for node canister 140a. Under such circumstances, data loss or corruption may occur through inadvertent removal of node canister 140b if it is active.

Figure 5:
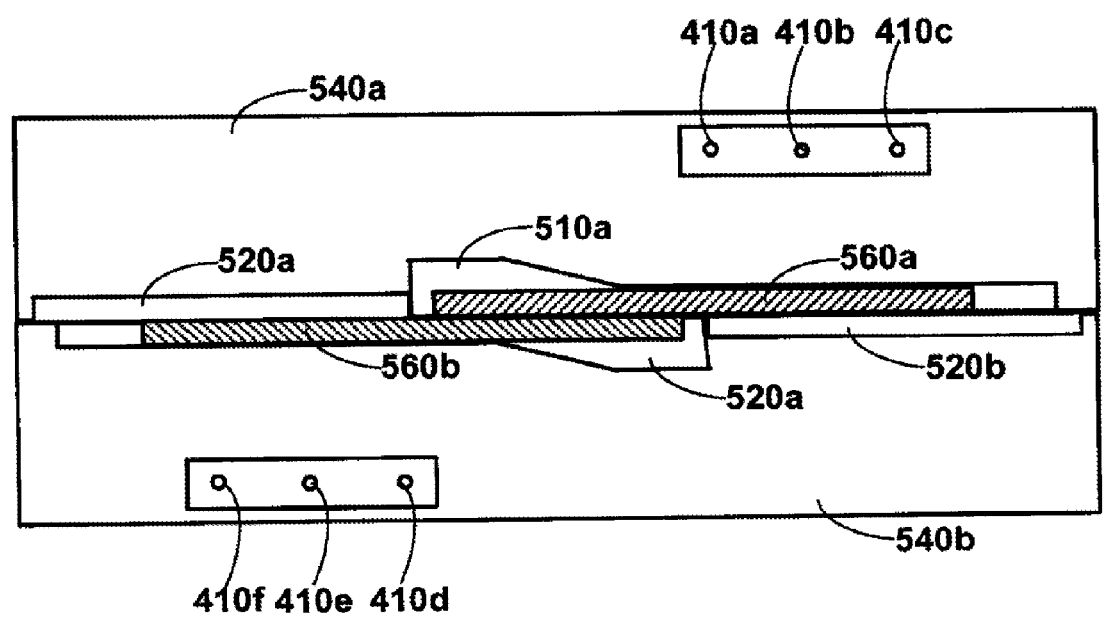
FIG. 5 illustrates a pair of node canisters incorporating an embodiment of the invention.

FIG. 5 illustrates a preferred embodiment of the present invention. In this preferred embodiment, node canisters 540a and 540b are substantially similar to node canisters 140a and 140b of the prior art. Node canister 540a comprises status and node identification LED indicators 410a-c as in the prior art. Node canister 540a further comprises two part release handle 510a, 520a. This release handle is similar to that of the prior art previously described. In this preferred embodiment, however, node canister release handle 510a, 520a comprises illuminable indicator portion 560a covering a portion of the surface of movable part 510a visible during normal use. Similarly, node canister 540b comprises two part release handle 510b, 520b, with illuminable indicator portion 560b covering a portion of the visible surface of movable part 510b. In a preferred embodiment, the portion of the visible surface of parts 510a, 510b occupied by illuminable indicator portions 560a, 560b, respectively, is a substantial portion. In a preferred embodiment, the substantial portion is at least 10 percent. In a preferred embodiment, the illuminable indicator portion each comprises an illuminable strip as illustrated in FIG. 5.

In a preferred embodiment, illuminable indicator portions 560a and 560b are electrically connected (or otherwise signally connected, for example by fiber optic connection) to control processor circuitry of, respectively, node canisters 540a and 540b. In operation, node canister control circuitry of node canisters 540a, 540b may switch on illumination of their respective illuminable indicator portions 560a, 560b when the canister requires replacement, and/or is in an operational state suitable for removal. It will be apparent to a person skilled in the art that this will greatly assist operation of the required node canister release handle. Such illumination may in a preferred embodiment correspond to particular illumination states of canister status and node identification LED indicator lights, 410a-c, 410d-f respectively.

In a preferred embodiment, illumination of illuminable indicator portion 560a indicates that node canister 540a requires replacement because of a fault condition and/or is in an operational state suitable for removal. A service engineer may thereby easily identify node canister release handle movable part 510a, and so operate correct release handle 510a, 520a for removal of node canister 540a. It will be apparent that an embodiment of the invention may be applied to an expansion canister of the IBM Storwize V7000 system in a substantially identical manner to that described with reference to node canisters 540a, 540b above.

In a preferred embodiment, illuminable indicator portions 560a, 560b comprise fiber optically illuminable portions, for example from a light emitting diode (LED) at one end of an optical fiber. In a further preferred embodiment, illuminable portions 560a, 560b comprise liquid crystal display (LCD) portions. In a further preferred embodiment illuminable indicator strips 560a, 560b comprise LED display portions. It will be apparent that any other suitable illumination devices may be used for indicator strips 560a, 560b without departing from the scope of the present invention.

It will be apparent to one skilled in the art that embodiments of the invention may be applied to any removable electronic digital data handling device, particularly where installed in a system with a number of other similar digital data handling devices. In one embodiment, the digital data handling devices are disk drive units, for example disk drives of 2.5 inch or 3.5 inch form factor. In another embodiment, the digital data handling devices are digital data processing units, for example blade servers. It will be apparent that in this embodiment the handle for removal may comprise a simple manually graspable element with no part movable relative to the digital data processing unit, for example blade server, and the illuminable strip may be applied to a substantial part of the graspable surface.

Figure 6:
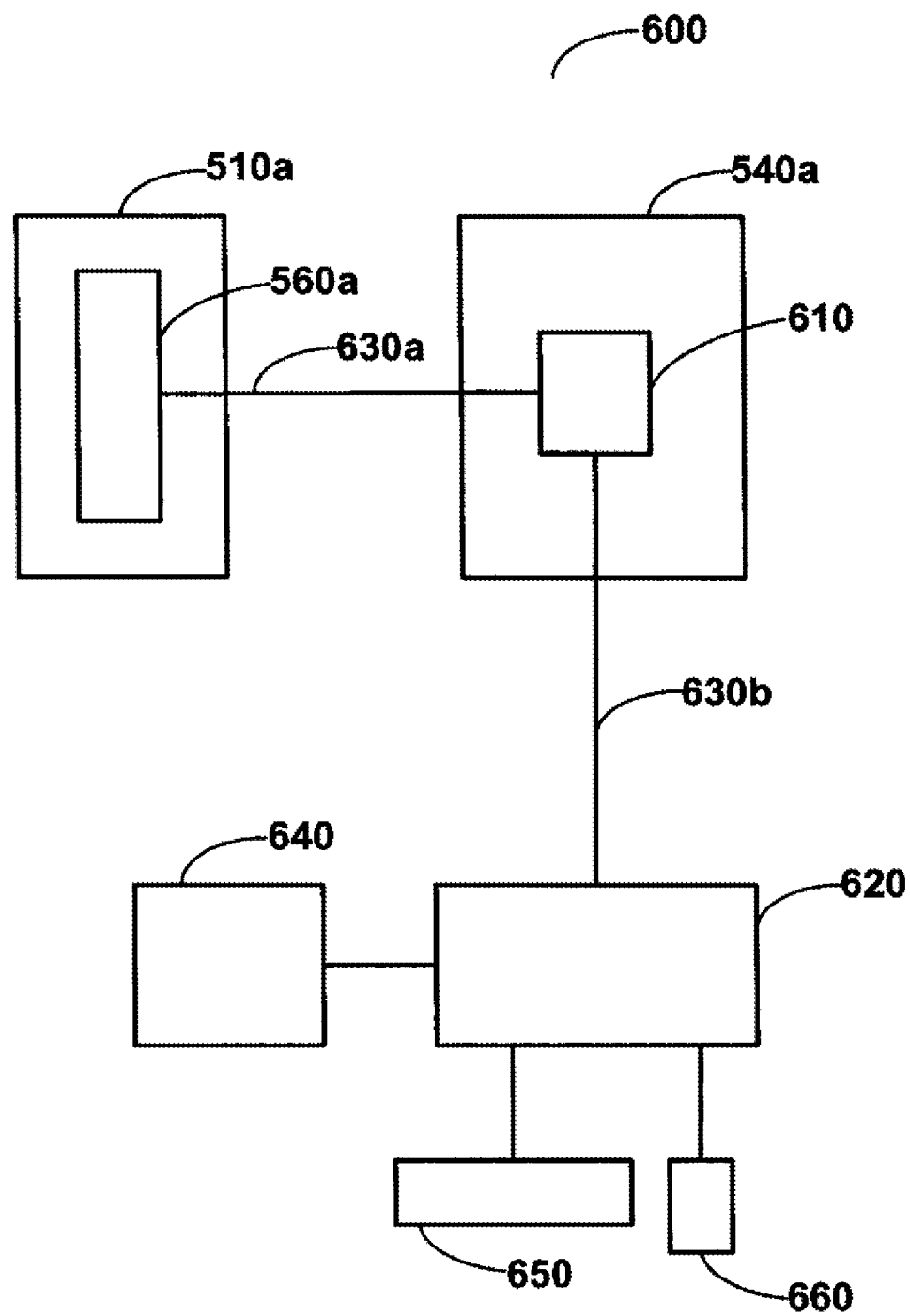
FIG. 6 illustrates a functional diagram of a system incorporating an embodiment of the invention.

It will be further apparent that many modes of operation of embodiments may be envisaged without departing from the scope of the invention. FIG. 6 illustrates an example simplified diagram of a system 600 suitable for operation of a preferred embodiment of the invention as previously described. Removable digital data handling unit, for example node canister 540a, comprises processing unit 610 electrically linked via connection 630a to illuminable strip 560a on movable release handle part 510a. Processing unit 610 is also electrically connected via connection 630b to system controller 620 which comprises operational software to control operation of the Storwize V7000 system of this embodiment. System controller 620 may comprise display 640, and operator input devices such as keyboard 650 and mouse 660.

In embodiments of the invention, operation of illuminable indicator strip, for example 540a, may be controlled automatically by control software running on data processing unit 610 of node canister 540a, or by control software running on system controller 620. In other embodiments, a human operator of system controller 620 may initiate the sending of a control signal to illuminable strip 560a to illuminate it for identification for user initiated canister removal. This may be, for example, by interacting with software running on system controller 620 and displayed on a user interface on display 640 by use of input devices such as keyboard 650 and mouse 660.

Figure 7:
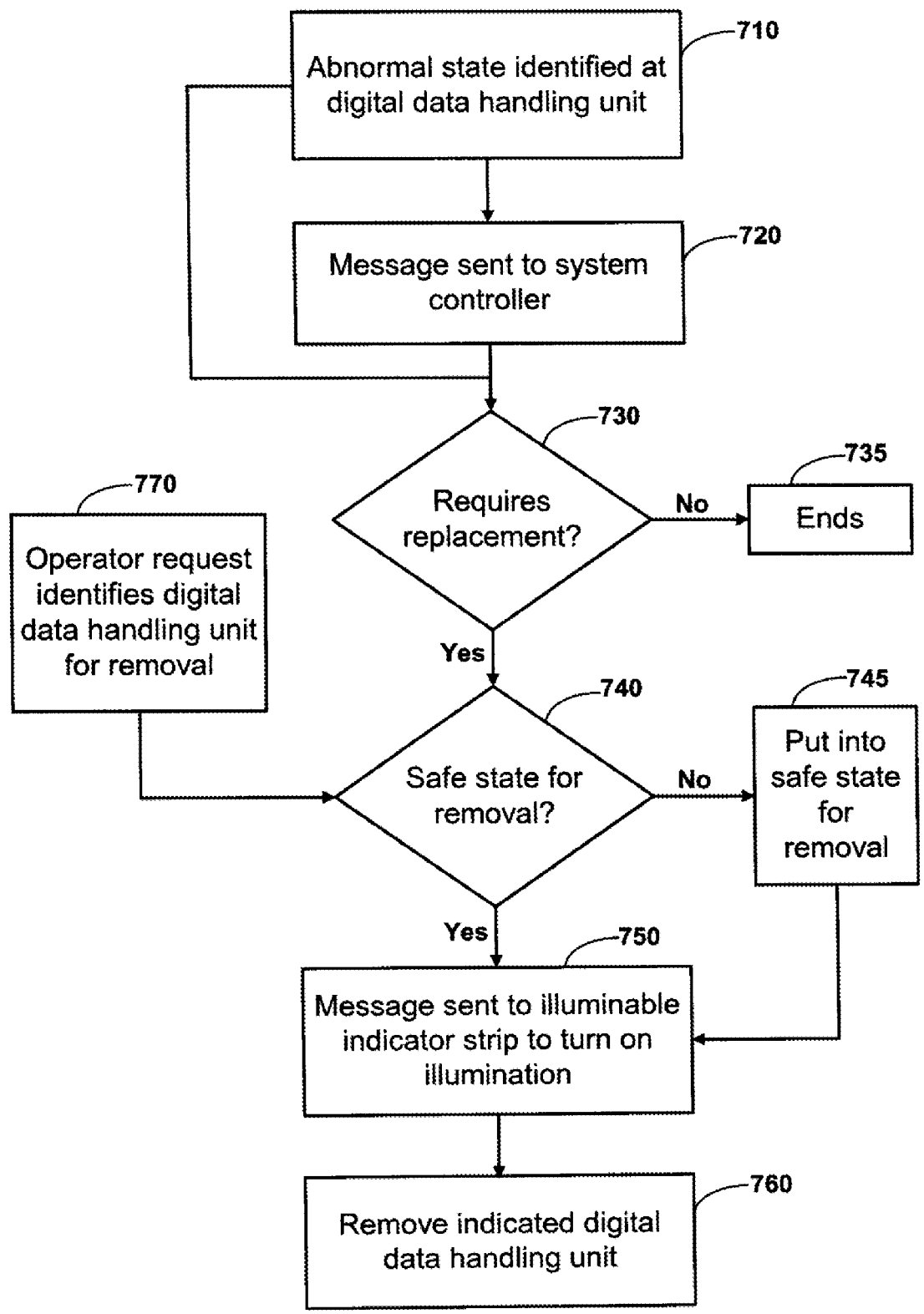
FIG. 7 illustrates a flow diagram of the operation of an embodiment of the invention.

FIG. 7 is a flow chart showing the sequence of operation of embodiments of the invention. At step 710, an abnormal state is identified at a removable digital data handling unit in a system as described with reference to any of the embodiments described above. This may constitute a fault, for example, which requires removal and replacement of the digital data handling unit. A message may be sent at step 720 to a system controller. The controller processor determines at step 730 whether the unit requires removal and replacement. Alternatively, this determination may be localized at the digital data handling unit. If it is determined that the unit does not require removal, the process ends at step 735. If it is determined that the unit does require removal, the process moves to determine whether the the unit is in a safe state for removal at step 740.

If it is determined that the unit is not in a safe state for removal, the process moves to step 745 at which point processes are put in train to put the unit into a state in which it is safe for removal. When the unit is in a safe state for removal, a message is sent, either from the central controller or locally at the digital data handling unit processor, to request that the illuminable indicator strip on the handle or other manually graspable element of the digital data handling unit be illuminated at step 750. The indicator strip is illuminated and the digital data handling unit so identified is removed at step 760.

In an alternative operation, an operator may request the identification of a particular digital data handling unit from an operator console at the central system controller, for example, at step 770. This may be by identification on a user interface on display 640, or otherwise by suitable identifier code. After checking that the digital data handling unit is in a safe state for removal at step 740, the process continues as previously described.

It will be appreciated by a person skilled in the art that further embodiments are possible without departing from the scope of the invention. The illuminable indicator strip, for example 560a, may operate by showing a constant illumination. Alternatively, other modes of operation may comprise, for example, various flashing modes to indicate different operational states. In further embodiments, illuminable indicator strip, for example 560a, may comprise a color identifying a particular type of digital data handling unit. In further embodiments, the illuminable indicator strip may comprise more than one color of illumination. In some embodiments, a different illumination color might be used to indicate different operation states of the digital data handling unit.

It will further be appreciated by a person skilled in the art that the digital data handling unit may in different embodiments comprise a data storage unit, a data processing unit, a data controller subsystem unit, a data communication unit, or one of a number of other removable units in the field of data processing, data handling and data communication.

As will be appreciated by one skilled in the art, aspects of the present invention may be embodied as a data handling unit, a system, or a method. Accordingly, aspects of the present invention may take the form of an entirely hardware embodiment, or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

It will be equally clear to one of skill in the art that all or part of a logic arrangement according to the preferred embodiments of the present invention may suitably be embodied in a logic apparatus comprising logic elements to perform the steps of the method, and that such logic elements may comprise components such as logic gates in, for example a programmable logic array or application-specific integrated circuit. Such a logic arrangement may further be embodied in enabling elements for temporarily or permanently establishing logic structures in such an array or circuit using, for example, a virtual hardware descriptor language, which may be stored and transmitted using fixed or transmittable carrier media.

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A component rack, comprising:
a plurality of vertically aligned slots configured to receive digital data handling units, and to couple the digital data handling units to a host computer;
a plurality of digital data handling units inserted into the plurality of vertically aligned slots, each data handling unit including a front surface that is visible and accessible when inserted into one of the slots;
each of the plurality of data handling units includes a latching mechanism that lockingly retains the data handling unit in a slot, and a two part handle that is linked to the latching mechanism and is manually accessible at the front surface of the data handling unit when the data handling unit is inserted in a slot;
a first part of the handle is moveably attached to the data handling unit by a hinged attachment point at one end of the first part of the handle that allows the unattached end of the first part of the handle to be moved from a position adjacent to the front face of the data handling unit outward from the front face of the data handling unit;
a second part of the handle engages the unattached end of the first part of the handle when the unattached end of the first part of the handle is in a position adjacent to the front face of the data handling unit so as to disallow movement of the first part of the handle;
the handle is operated such that by squeezing the first and second parts of the handle together, the latching mechanism is released, which allows the first part of the handle to move outward from the front face of the data handling unit, configuring a graspable portion of the handle to enable the removal of the data handling unit from the component rack;
the handle further includes an illuminable portion that is visible at the front face of the data handling unit, wherein illuminating the illuminable portion is controlled by the host computer to indicate that the data handling unit is in an operational state suitable for removal from the component rack, and to further indicate the particular handle to operate to remove the data handling unit from the component rack.

2. A component rack in accordance with claim 1, wherein the illuminable portion covers a substantial portion of the first part of the handle that is visible when the digital data handling unit is inserted into a slot.

3. A component rack in accordance with claim 2, wherein the substantial portion is at least 10 per cent.

4. A component rack in accordance with claim 1, wherein the illuminable portion comprises an illuminable strip.

5. A component rack in accordance with claim 1, wherein the illuminable portion is illuminated in response to an abnormal condition of the digital data handling unit.

6. A component rack in accordance with claim 1, wherein the illuminable portion comprises one of: a fiber optically illuminated portion, a liquid crystal display portion, or a light emitting diode portion.

7. A component rack in accordance with claim 1, wherein the illuminable portion illuminates in a plurality of colors, wherein different colors indicate different operational states of the digital data handling unit.

* * * * *